(12) United States Patent
De Groot et al.

(10) Patent No.: US 7,244,631 B1
(45) Date of Patent: Jul. 17, 2007

(54) MEMS SURFACE MODIFICATION FOR PASSIVE CONTROL OF CHARGE ACCUMULATION

(75) Inventors: Wilhelmus De Groot, Palo Alto, CA (US); James A. Hunter, Campbell, CA (US); Josef Berger, Los Altos, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 22 days.

(21) Appl. No.: 11/145,060

(22) Filed: Jun. 3, 2005

Related U.S. Application Data

(60) Provisional application No. 60/581,935, filed on Jun. 21, 2004.

(51) Int. Cl.
*H01L 21/00* (2006.01)

(52) U.S. Cl. ........................................ 438/48; 438/778

(58) Field of Classification Search ............ 438/48–52, 438/778, 788
See application file for complete search history.

(56) References Cited

U.S. PATENT DOCUMENTS

| | | | |
|---|---|---|---|
| 2,671,078 A | * | 3/1954 | McCormack ................ 528/362 |
| 6,054,374 A | * | 4/2000 | Gardner et al. ............. 438/528 |
| 6,387,723 B1 | | 5/2002 | Payne et al. |
| 6,660,552 B2 | | 12/2003 | Payne et al. |

* cited by examiner

*Primary Examiner*—Dung A. Le
(74) *Attorney, Agent, or Firm*—Okamoto & Benedicto LLP

(57) ABSTRACT

In one embodiment, a method of treating a surface of a Micro-Electromechanical System (MEMS) device reduces or eliminates performance degradation due to charge migration and accumulation. Briefly, the method may include treating a dielectric surface of the MEMS device to replace hydroxyl groups with electrically neutral molecules, thereby converting the dielectric surface from a hydrophilic to a substantially hydrophobic nature. A MEMS device having a surface treated using the aforementioned method is also disclosed.

10 Claims, 3 Drawing Sheets

US 7,244,631 B1

MEMS SURFACE MODIFICATION FOR PASSIVE CONTROL OF CHARGE ACCUMULATION

REFERENCE TO RELATED APPLICATION

This application claims the benefit of U.S. Provisional Application No. 60/581,935, filed on Jun. 21, 2004, which is incorporated herein by reference in its entirety.

BACKGROUND OF THE INVENTION

1. Field of the Invention

The present invention relates generally to Micro-Electromechanical System (MEMS) devices, and more particularly but not exclusively to techniques for controlling charge accumulation on surfaces of MEMS or electro-statically actuated devices.

2. Description of the Background Art

In many Micro-Electromechanical System (MEMS) devices, electrostatic actuation is used to move micromechanical structures. An example of a MEMS device that uses electrostatic actuation is the ribbon-type light modulator, such as the Grating Light Valve (GLV™) light modulator commercially available from Silicon Light Machines, Inc., of Sunnyvale, Calif. A ribbon-type light modulator generally includes a number of ribbons, each having a light-reflective surface supported over a substrate by a resilient microstructure. A ribbon may be deflectable towards the substrate to form an addressable diffraction grating with adjustable diffraction strength. A ribbon may be electro-statically deflected towards the substrate by drive electronics.

One problem frequently encountered with conventional electro-statically operated MEMS is the accumulation or build-up of charge on dielectric surfaces of the ribbons or substrate. Such charge build-up occurs when these surfaces are charged by ions driven by electric field on the surface or across the bulk dielectric. As a result, the voltages required to effect actuation will vary over time, dependent on the history of the applied electric field and external environmental conditions, such as temperature and humidity. In addition, it has been found that charge behavior of dielectric structures appears to be strongly dependent on surface conditions. Dielectric surface charge build-up is therefore difficult to gauge, leading to operational conditions that change over time to the extent that controlled operation becomes difficult if not impossible.

Prior art approaches to charge mitigation and prevention of build-up generally consist of a long bake-out period of the MEMS device in dry nitrogen, with alternate purge and bake periods, to drive off the most likely charge carrier—water. The bake-out is followed by subsequent hermetic sealing of the MEMS device. Several embodiments of this approach have been described in, for example, commonly-assigned U.S. Pat. Nos. 6,660,552, and 6,387,723.

Although an improvement over previous approaches, the bake-out approach has not been wholly satisfactory for a number of reasons. First, baking water from the surfaces of the MEMS device is a reversible process, which means that all presence of water should be prevented over the device lifetime, an impossible condition to achieve. Second, the lengthy bake-purge cycle extends the production process leading to increased production cost and lower throughput. Finally, the bake cycle itself can lead to complications, such as non-uniformity of device properties due to non-uniform heating, thereby reducing production yield. Baking at temperature levels acceptable to the device only partially drives off water, leaving residual amounts. Performance testing of sealed devices shows that initially surface passivation appears to slow charge rates, but over time, charging appears to increase, possibly due to a gradual increase in surface adsorbed water emerging from baked-out surfaces, until an equilibrium is reached.

In addition to the above, prior art approaches require hermetic seals, which can pose further difficulties or problems and increase production cost and lower yield.

Accordingly, there is a need to control the accumulation or build-up of charge on dielectric surfaces, such that electrostatic forces on the ribbons or movable members are determined solely by the voltages applied to the electrodes. It is desirable that the reduction of charge build-up is sufficient to enable more accurate control of MEMS devices, even those exposed to ambient conditions during operation. It is further desirable that the reduction of charge build-up is sufficient to avoid stability issues and prevent potential catastrophic charge build-up (e.g. snap-down).

SUMMARY

In one embodiment, a method of treating a surface of a Micro-Electromechanical System (MEMS) device reduces or eliminates performance degradation due to charge migration and accumulation. Briefly, the method may include treating a dielectric surface of the MEMS device to replace hydroxyl groups with electrically neutral molecules, thereby converting the dielectric surface from a hydrophilic to a substantially hydrophobic nature. A MEMS device having a surface treated using the aforementioned method is also disclosed.

These and other features and advantages of the present invention will be apparent to one of ordinary skill in the art after reading the entirety of this disclosure, which includes the accompanying drawings and claims.

Figure 1A:
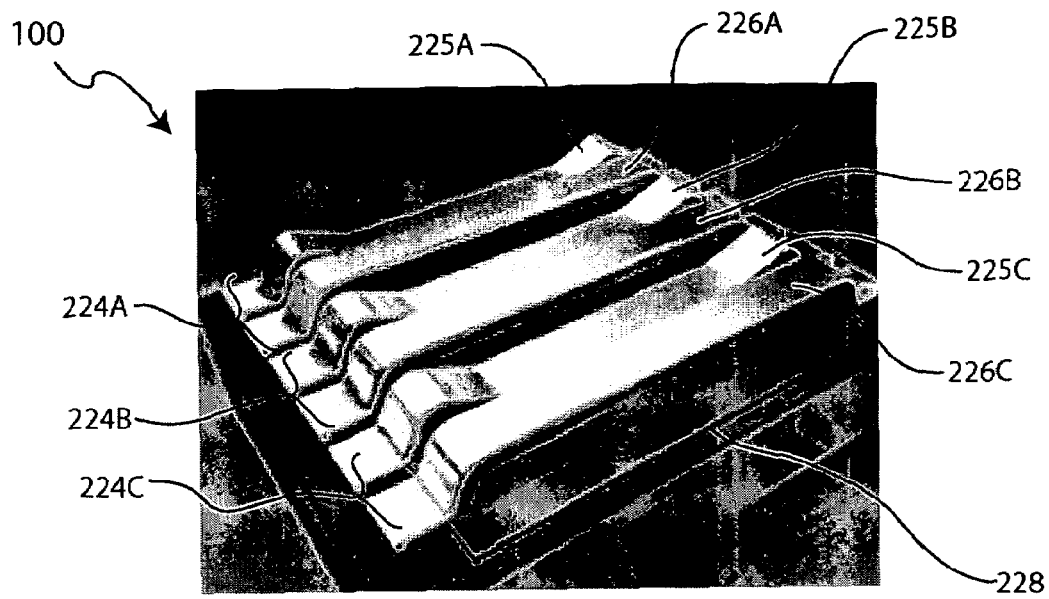
FIGS. 1A–1D schematically illustrate a ribbon-type diffractive spatial light modulator having at least one dielectric surface treated to prevent charge accumulation in accordance with an embodiment of the present invention.

The use of the same reference label in different drawings indicates the same or like components.

DETAILED DESCRIPTION

The present invention relates generally to Micro-Electromechanical System (MEMS) devices having dielectric surfaces that are treated to prevent performance degradation due to charge migration and accumulation, and to methods of manufacturing the same. It is to be noted, however, that embodiments of the present invention may also be employed to prevent charge migration and accumulation in other types of devices.

In one embodiment, a method of the present invention modifies a dielectric surface from a hydrophilic to a substantially hydrophobic nature by permanent (i.e. irreversible) surface modification. Many dielectric surface structures terminate in hydroxyl (OH) groups resulting from water molecules adsorbed on the surface. This creates a high surface energy and a susceptibility of charge carrier accumulation in several monolayers of water at the dielectric surface. In the presence of sufficient ambient water partial pressure, this could be many monolayers of water. In one embodiment, substantially all of the hydroxyl groups at the dielectric surface are replaced with electrically neutral molecules, to form a passivated surface cover that is hydrophobic. To that end, in one embodiment, the hydroxyl groups may be replaced with fluorine or chlorine, which in turn may be replaced with polymer chains. Saturation of the surface with a cover of these polymer chains forms a highly hydrophobic surface that is resistant to surface charge build-up.

Substantial reduction in charge rates, i.e., reduction by several orders of magnitude, have been obtained for MEMS devices treated or produced by the inventive method and operating in ambient or open environments. Thus, hermeticity is not a requirement to prevent charge migration and accumulation using the inventive process.

Generally, the inventive process involves forming a substantially uniform and continuous polymer monolayer overlying at least one dielectric surface of the MEMS device.

A process for forming a substantially uniform and continuous polymer monolayer over a dielectric surface of a MEMS device according to an embodiment of the present invention will now be described in greater detail with reference to FIGS. 1A–1D, 2, and 3. For purposes of clarity, many of the details of MEMS devices and MEMS device fabrication or manufacturing techniques that are widely known and are not relevant to the present invention have been omitted from the following description.

One type of MEMS device for which the present invention is particularly useful is a ribbon-type diffractive spatial light modulator, such as a Grating Light Valve (GLV™) light modulator commercially available from Silicon Light Machines, Inc., of Sunnyvale, Calif. FIG. 1 schematically shows an example ribbon-type diffractive spatial light modulator 100 in accordance with an embodiment of the present invention. The light modulator 100 may comprise an array of ribbon pairs 224 (i.e., 224A, 224B, 224C). Each ribbon pair 224 comprises a fixed ribbon 226 (i.e., 226A, 226B, 226C) and a deflectable ribbon 225 (i.e., 225A, 225B, 225C), electrically isolated from one another. Each ribbon (i.e., a ribbon 225 or 226) may be a silicon nitride microstructure coated with a reflective and conductive layer of aluminum. Ribbon pairs 224 may be fabricated using MEMS technology.

Figure 1B:
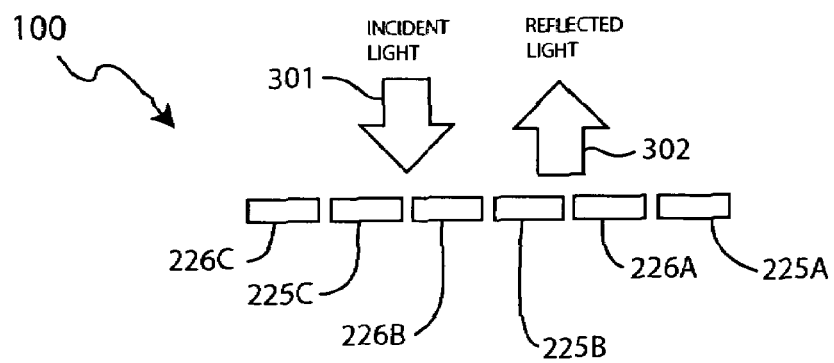
Figure 1C:
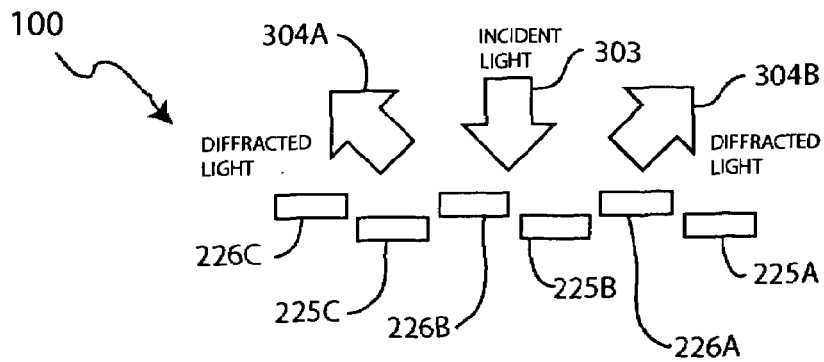
Figure 1D:
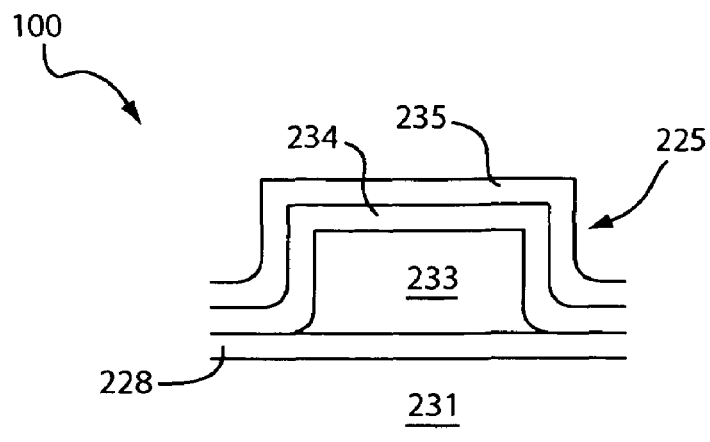

Ribbon pairs 224 are suspended above a gap (e.g. see gap 233 on FIG. 1D). Underneath ribbon pairs 224 is a common bottom electrode 228, which may be set at ground potential. Applying a bias voltage on one ribbon of a ribbon pair 224 results in an electrostatic force that attracts a deflectable ribbon 225 towards bottom electrode 228, thus deflecting the deflectable ribbon 225. A fixed ribbon 226 is kept at the same potential as the common electrode, and stays relatively un-deformed during this time. Removing the bias voltage causes the deflectable ribbon 225 to spring back to its original un-deformed shape. The amount by which a ribbon 225 is deflected towards bottom electrode 228 depends on the applied bias voltage.

FIG. 1B schematically shows the light modulator 100 in a specular state, which is a state where no bias voltage is applied on ribbon pairs 224. In the specular state, deflectable ribbons 225 and fixed ribbons 226 are un-deflected, thereby causing an incident light 301 to reflect off the surface of the ribbons as a reflected light 302.

FIG. 1C schematically shows the light modulator 100 in a diffraction state, which is a state where a bias voltage is applied on one ribbon of ribbon pairs 224. In the diffraction state, deflectable ribbons 225 are deflected while fixed ribbons 226 remain un-deflected. As shown in FIG. 1C, this causes portions of an incident light 303 to diffract off the surface of the ribbons as diffracted light 304 (i.e., 304A, 304B). Diffracted light 304 is referred to as $1^{st}$ order diffraction, and can be utilized to form an image. The remaining portions of incident light 303, if any, are reflected back. This reflected light is referred to as $0^{th}$ order. Thus, by controlling the bias voltage on ribbon pairs 224, the power level of light reflected or diffracted on the light modulator 100 may be attenuated as shown in FIG. 1C. Drive electronics is employed to control and address the ribbon pairs 224 to modulate the reflected and diffracted light.

FIG. 1D schematically shows a side cross-sectional view of a deflectable ribbon 225 of the light modulator 100. A deflectable ribbon 225 may have a resilient micro-structure comprising a dielectric supporting structure 234 and an optically reflective layer 235. In one embodiment, the dielectric supporting structure 234 comprises silicon nitride, while the reflective layer 235 comprises aluminum. A gap 233 separates the deflectable ribbon 225 from the bottom electrode 228, which is formed over the substrate 231 (e.g. silicon substrate). There may be intermediate layers between the bottom electrode 228 and the substrate 231 depending on implementation. Fixed ribbons 226 generally have a structure similar to that of deflectable ribbons 225.

Dielectric surfaces on the underside of the ribbons and/or the top surface of the substrate (when encased silicon is used for bottom electrode) may be treated to prevent charge accumulation and migration in accordance with embodiments of the present invention. In one embodiment, the surface of the dielectric supporting structure 234 facing the gap 233 (i.e. towards the substrate) is treated to prevent charge accumulation thereon. In another embodiment, the top surface of the substrate 231 is treated to prevent charge accumulation on the top of the substrate 231 in embodiments where encased silicon is used as a bottom electrode 228. In yet another embodiment, the surface of the bottom electrode 228 facing the gap 233 is treated to prevent charge accumulation thereon in embodiments where the bottom electrode 228 comprises titanium nitride of which the top layer has oxidized to form a substantial layer of titanium oxide.

Figure 2:
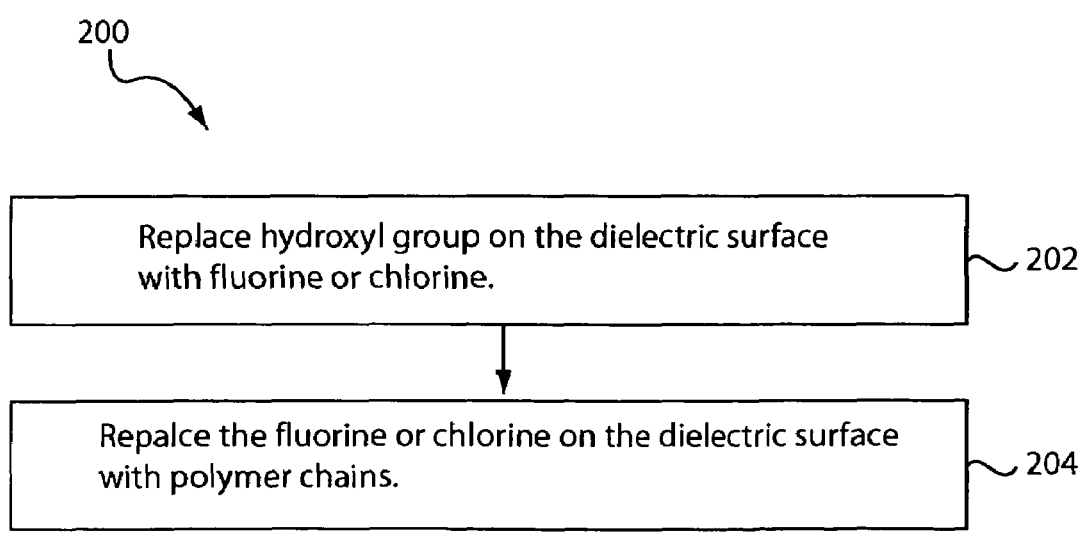
FIG. 2 shows a flow diagram of a method of treating a dielectric surface of a MEMS device to prevent charge accumulation in accordance with an embodiment of the present invention.

FIG. 2 shows a flow diagram of a method 200 of treating a dielectric surface of a MEMS device to prevent charge accumulation in accordance with an embodiment of the present invention. The method 200 converts the dielectric surface from a hydrophilic to a substantially hydrophobic nature, thereby preventing charge accumulation on the dielectric surface.

The method 200 begins with the step 202 of replacing hydroxyl (OH) groups on a dielectric surface with fluorine or chlorine. Subsequently, in step 204, fluorine or chlorine on the dielectric surface is replaced with polymer chains to form a monolayer on the dielectric surface. The method 200 replaces the hydroxyl groups on the dielectric surface to form a surface cover on the dielectric surface that is substantially hydrophobic. The method 200 may be used to treat one or more dielectric surfaces of a MEMS device.

In one embodiment, the step 202 of replacing hydroxyl groups on the dielectric surface with fluorine or chlorine is accomplished, for example, by: (i) flowing an inert gas through a liquid reservoir of fluorine or chlorine solution to form a fluorine or chlorine vapor; and (ii) flooding a partially sealed vessel containing the MEMS device with the fluorine or chlorine vapor. Optionally, the method further includes the step of heating the MEMS device to a predetermined temperature to activate the chemistry of the fluorine or chlorine prior to or after flooding the partially sealed vessel. Preferably, the predetermined temperature is from about 80 to about 100° C.

Similarly, in one embodiment, the step 204 of replacing the fluorine or chlorine on the dielectric surface with polymer chains is accomplished by flowing an inert gas through a liquid reservoir containing selected polymer chains solution to form polymer in a gaseous physical state, and flooding a partially sealed vessel containing the MEMS device with the polymer in a gaseous physical state. Step 204 can further include the step of heating the MEMS device to a predetermined temperature from about 20 to about 100° C., depending on the polymer chain type, prior to or after flooding the partially sealed vessel to activate the chemistry of the polymer.

Preferably, the polymer employed in the step 204 comprises a material selected from a group consisting of perfluoro-n-decanoic acid (PFDA), dimethyldichlorosilane (DDMS), tridecafluoro-1,1,2,2-tetrahydrooctyltrichlorosilane (FOTS), and perfluorodecyltris(dimethylamino)silane (PF10TAS).

Figure 3:
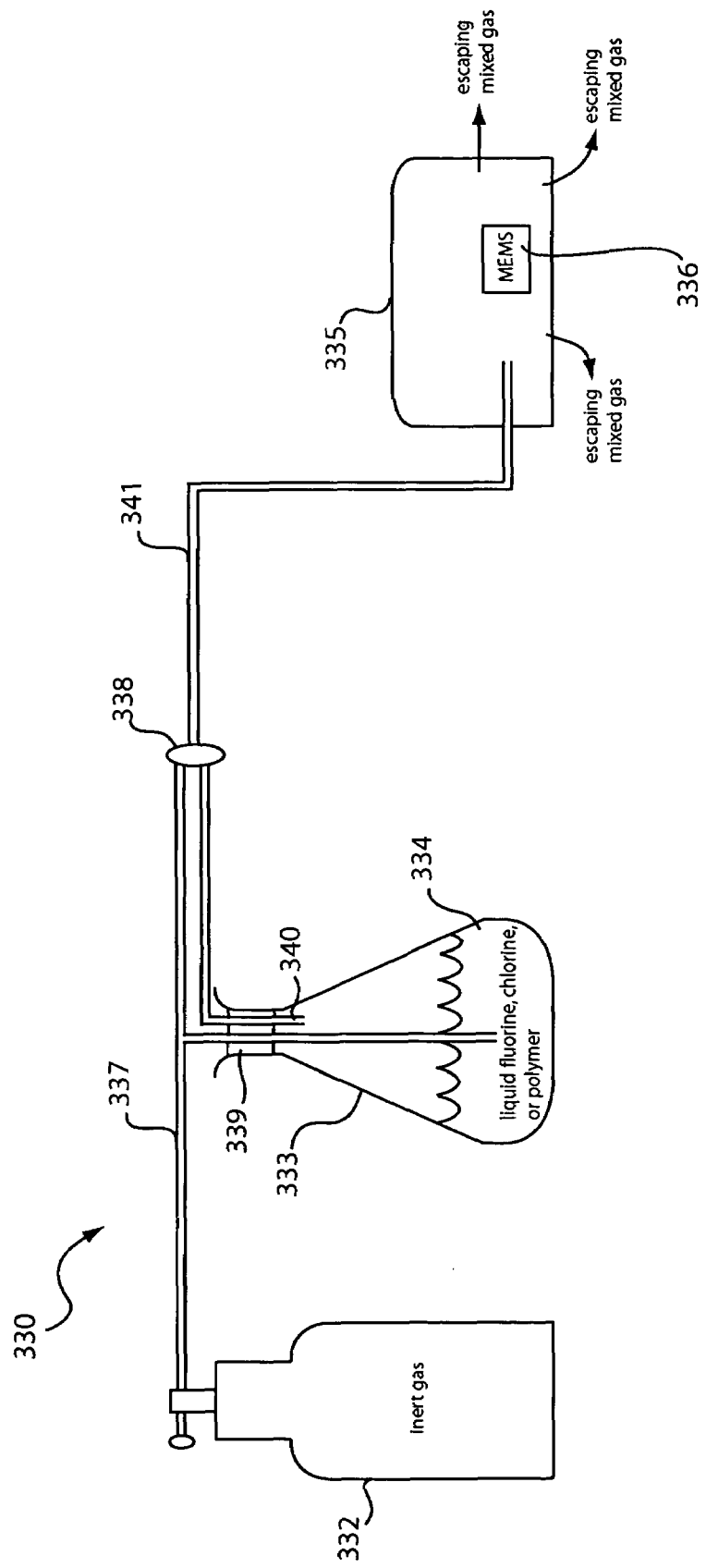
FIG. 3 shows a schematic representation of equipment suitable for treating dielectric surfaces of MEMS devices in accordance with an embodiment of the present invention.

FIG. 3 shows a schematic representation of equipment suitable for performing the method 200 according to an embodiment of the present invention. In the example of FIG. 3, a flask 333 is used to hold a liquid 334 reservoir of the fluorine or chlorine (for step 202) or the polymer material (for step 204). A source 332 of dry inert gas, which is nitrogen ($N_2$) gas in one embodiment, is passed through plumbing 337 and a seal 339 to bubble through the liquid 334 in the flask 333. A gas vapor at about 100% vapor pressure passes back out of the flask 333 by way of plumbing 340 through the seal 339 and to a mixing valve 338 where it is mixed with the dry nitrogen from the source 332 to a desired relative concentration. The mixed gas is flowed from the mixing valve 338, through plumbing 341, and into a partially evacuated vessel 335 in which the MEMS device 336 having surfaces to be treated has been placed. The mixed gas is allowed to escape from the vessel 335 to maintain a constant relative vapor pressure. The just-described use of the equipment may be employed to perform step 202 first (liquid fluorine or chlorine solution in the flask 333), then step 204 (liquid polymer in the flask 333).

In an alternative embodiment, once the appropriate relative vapor pressure is achieved, the vessel 335 could be hermetically sealed to maintain that vapor pressure of the precursor gas Optionally, the MEMS device 336 having the treated dielectric surfaces is hermetically sealed in a lithographically-formed structure on a substrate following the heating step to activate the chemistry of the polymer as in the step 204.

Besides the method 200, the inventors believe that some processes for preventing sticktion may also be used to treat dielectric surfaces to prevent charge migration and accumulation thereon. These sticktion-prevention processes include those disclosed in commonly-assigned U.S. Pat. No. 6,251, 842, which is incorporated herein by reference in its entirety, and those employed in the coating service or coating equipment offered by Applied MicroStructures of San Jose, Calif. and MicroSurfaces, Inc of Minneapolis, Minn.

The advantages of a MEMS device having dielectric surfaces treated according to the present invention over conventional MEMS devices include: (i) irreversible surface energy modification that will permanently resist water adsorption and thus charge accumulation; (ii) no hermetic sealing of the device in an inert environment is required, improving yield; (iii) elimination of long tedious bake and purge cycles; (iv) increased operational stability of the device under any applied electric field; and (v) wider range of possible dielectric materials available for use in the device due to relaxation/elimination of consideration with regard to hydrophilic nature of such dielectric materials.

While specific embodiments of the present invention have been provided, it is to be understood that these embodiments are for illustration purposes and not limiting. Many additional embodiments will be apparent to persons of ordinary skill in the art reading this disclosure. The invention is thus limited only by the following claims and their equivalents.

What is claimed is:

1. A method of reducing charge accumulation in a Micro-Electromechanical System (MEMS) device, the method comprising:

treating a surface of a dielectric of a MEMS device to convert the surface of the dielectric from a hydrophilic to a substantially hydrophobic nature and prevent charge from accumulating on the surface of the dielectric;

wherein treating the surface of the dielectric comprises replacing hydroxyl (OH) groups on the surface of the dielectric with electrically neutral molecules.

2. The method of claim 1 wherein the dielectric comprises silicon nitride.

3. The method of claim 1 wherein the dielectric is part of a resilient micro-structure that supports a reflective layer over an air gap, the micro-structure and the reflective layer being configured to deflect towards a substrate.

4. The method of claim 1 wherein the MEMS device is electro-statically actuated.

5. The method of claim 1 wherein the MEMS device has a plurality of ribbon pairs suspended over a substrate, each of the ribbon pairs having a deflectable ribbon and a fixed ribbon, the fixed ribbon being configured to stay relatively taut when the deflectable ribbon is electro-statically deflected towards the substrate.

6. The method of claim 1 wherein the MEMS device is a ribbon-type diffractive spatial light modulator.

7. A method of reducing charge accumulation in a Micro-Electromechanical System (MEMS) device, the method comprising:

treating a surface of a dielectric of a MEMS device to convert the surface of the dielectric from a hydrophilic to a substantially hydrophobic nature and prevent charge from accumulating on the surface of the dielectric;

wherein treating the surface of the dielectric comprises replacing hydroxyl (OH) groups on the surface of the dielectric with fluorine or chlorine, and replacing the fluorine or chlorine on the surface of the dielectric with polymer chains to form a monolayer that is substantially hydrophobic on the surface of the dielectric.

8. The method of claim 7 wherein replacing the OH groups on the surface of the dielectric with the fluorine or chlorine comprises:

flowing an inert gas through a liquid reservoir of the fluorine or chlorine solution to form fluorine or chlorine vapor;

flooding a partially sealed vessel containing the MEMS device with the fluorine or chlorine vapor; and heating the MEMS device to a predetermined temperature to activate the chemistry of the fluorine or chlorine to replace adsorbed water molecules.

9. The method of claim 7 wherein replacing the fluorine or chlorine on the surface of the dielectric with polymer chains comprises:

flowing an inert gas through a liquid reservoir containing a selected polymer to form a polymer in a gaseous physical state;

flooding a partially sealed vessel containing the MEMS device with the polymer in the gaseous physical state; and heating the MEMS device to a predetermined temperature to activate the chemistry of the polymer on the surface of the dielectric.

10. The method of claim 9 wherein the polymer is selected from a group consisting of perfluoro-n-decanoic acid (PFDA), dimethyldichlorosilane (DDMS), tridecafluoro-1,1,2,2-tetrahydrooctyltrichlorosilane (FOTS), and perfluorodecyltris(dimethlyamino)silane (PF10TAS).

* * * * *